US007421676B2

(12) United States Patent
Tan et al.

(10) Patent No.: US 7,421,676 B2
(45) Date of Patent: Sep. 2, 2008

(54) SYSTEM AND METHOD FOR PHASE SHIFT ASSIGNMENT

(75) Inventors: Sia Kim Tan, Singapore (SG); Qunying Lin, Singapore (SG); Liang-Choo Hsia, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 418 days.

(21) Appl. No.: 10/942,689

(22) Filed: Sep. 15, 2004

(65) Prior Publication Data

US 2006/0075376 A1    Apr. 6, 2006

(51) Int. Cl.
G06F 17/50 (2006.01)
(52) U.S. Cl. ........................................ 716/19
(58) Field of Classification Search .............. 716/19
See application file for complete search history.

(56) References Cited

U.S. PATENT DOCUMENTS

| 6,524,752 | B1  |   | 2/2003 | Pierrat  |        |
|-----------|-----|---|--------|----------|--------|
| 6,584,610 | B1  |   | 6/2003 | Wu et al.|        |
| 6,610,449 | B2  |   | 8/2003 | Pierrat  |        |
| 6,698,007 | B2  | * | 2/2004 | Wu et al.| 716/19 |
| 2002/0046392 | A1 | * | 4/2002 | Ludwig et al. | 716/19 |
| 2002/0129327 | A1 | * | 9/2002 | Pierrat et al. | 716/19 |
| 2002/0155362 | A1 | * | 10/2002 | Heissmeier et al. | 430/5 |
| 2002/0197543 | A1 | * | 12/2002 | Pierrat et al. | 430/5 |
| 2004/0184804 | A1 | * | 9/2004 | Shahar | 398/79 |
| 2004/0191650 | A1 | * | 9/2004 | Pierrat | 430/5 |
| 2004/0202965 | A1 | * | 10/2004 | Pierrat et al. | 430/311 |
| 2005/0042527 | A1 | * | 2/2005 | Pierrat | 430/5 |
| 2005/0180293 | A1 | * | 8/2005 | Ueyama et al. | 369/112.05 |
| 2006/0040188 | A1 | * | 2/2006 | Liebmann et al. | 430/5 |

OTHER PUBLICATIONS

Pierrat, Christophe, "Full Phase-Shifting Methodology for 65nm Node Lithography", Oct. 1, 2002, White Paper on www.Synopsys.com web site.
Pierrat, Christophe, Frank Driessen, and Geert Vandenberghe "Full Phase-Shifting Methodology for 65nm Node Lithography", Proceedings of SPIE—vol. 5040, Optical Microlithography XVI, Jun. 2003, pp. 282-293.

* cited by examiner

*Primary Examiner*—Jack Chiang
*Assistant Examiner*—Suchin Parihar
(74) *Attorney, Agent, or Firm*—Mikio Ishimaru

(57) ABSTRACT

A semiconductor design is provided having at least one feature at one of a line end and a line junction, and phase regions. At least one cut line is added to at least one of such features at line ends and such features at line junctions. Phases are assigned to the phase regions. The manufacturing of a photomask with the assigned phase regions is directed.

16 Claims, 9 Drawing Sheets

SYSTEM AND METHOD FOR PHASE SHIFT ASSIGNMENT

TECHNICAL FIELD

The present invention relates generally to photolithography and more particularly to patterning different types of photolithography features.

BACKGROUND ART

Integrated circuits are now used in almost every type of electronic product ranging from toys to massive computers. These integrated circuits are all generally made by a photolithographic process, which involves manufacturing a template containing patterns of the electrical circuit as transparent and opaque areas. The patterned template is referred to as a "reticle" or "mask".

A radiation source, such as a light, is used to copy or "pattern" multiple images of the mask onto a photosensitive material, such as a photoresist, on the surface of a silicon wafer. Once features are patterned on the photoresist, further processing is performed to form various structures on the silicon wafer. The completed wafer is then cut (or "diced") to form the individual integrated circuits.

Engineers typically use computer aided design ("CAD") to create a schematic design of the mask. One technique, Levenson Phase-Shifting, also known as Alternating Aperture Phase-Shifting, is used to create small features on integrated circuits. Such small features are generated by a pair of areas in the mask called shifters.

Shifters change the phase of the light passing through them. Two shifters can be used to shine light on the same region of a photoresist. When the light passing through one of the shifters is out of phase with the light passing through the other shifter, a feature is created on the photoresist that is narrower than the distance between the two shifters. By reducing the distance between the two shifters, very small features can be created on the photoresist. The width of the feature can be considerably less than could be produced by the same optical system without phase shifting.

However, the use of phase shift masking in dense designs results in a large increase in the complexity of mask layout. One problem, when laying out phase shift areas on dense designs, is phase conflicts. Phase conflicts are due to poor phase assignment and typically occur at line-end and T-junction structures.

One type of phase conflict occurs when two phase shift regions having the same phase are laid out to create a feature. If the phase shift regions have the same phase, they will not create the desired feature. Thus, it is necessary to correct the phase shift regions so that they are no longer in the same phase.

However, correcting phase shift problems in one area of a complex mask layout may produce phase problems in other areas of the mask layout. As designs become more complex, the time and effort involved in correcting phase shift problems increase dramatically.

Conventional design systems try to reassign phases of individual pairs to resolve conflicts at the end of the design process, when all the phase conflicts are apparent. Sometimes, however, a phase shift conflict cannot be resolved. Discovery of such irresolvable phase shift conflicts requires the design engineers to start over at the early CAD process stage. The design and conflict resolution processes are then repeated until final design layouts without phase-shift conflicts are produced.

Unfortunately, this procedure greatly increases the number of days it takes to begin producing integrated circuits. In the modern marketplace, where advancements occur daily, such delays can cause significant loss of market share and revenue.

To solve this problem, chip manufacturing facilities have imposed design rules to restrict engineers from creating patterns which result in phase shift conflicts. However this solution overly restricts engineers and excessively limits designs. What is needed is an easier, faster, and more efficient way to resolve phase shift conflicts.

Solutions to these problems have been long sought but prior developments have not taught or suggested any solutions and, thus, solutions to these problems have long eluded those skilled in the art.

DISCLOSURE OF THE INVENTION

A method for phase shift assignment provides a semiconductor design having at least one feature at one of a line end and a line junction, and phase regions. At least one cut line is added to at least one of such features at line ends and such features at line junctions. Phases are assigned to the phase regions. The manufacturing of a photomask with the assigned phase regions is directed.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings are semi-diagrammatic and not to scale and, particularly, some of the dimensions are for the clarity of presentation and are shown exaggerated in the FIGS.

The present system is described with respect to wavelengths in the ultra-violet range. However, it will be readily understood that the invention is applicable to any wavelength of radiation, and the modifications for other wavelengths will be obvious to those of ordinary skill in the art based on the description of an embodiment of the present invention provided herein.

Figure 1:
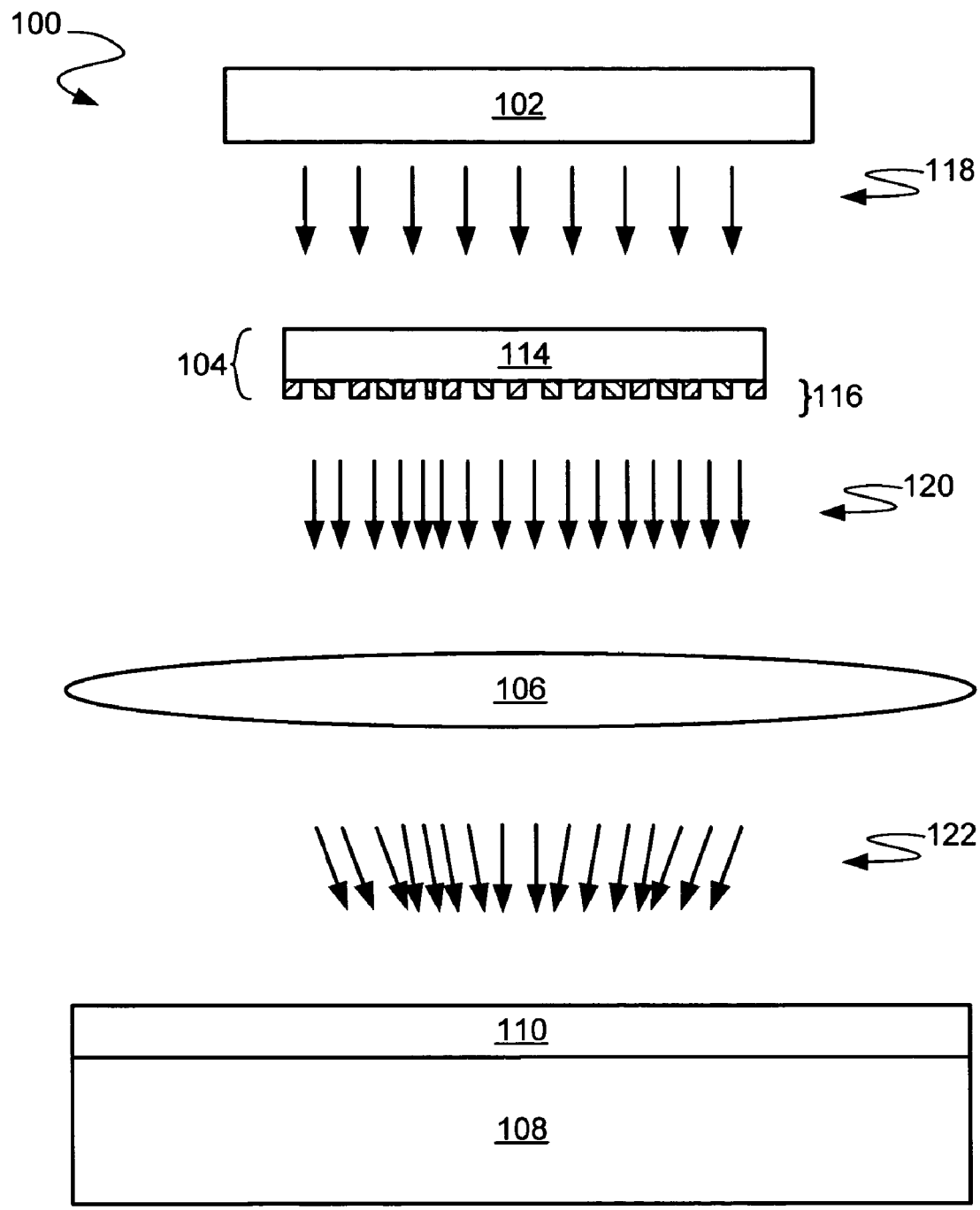
FIG. 1 is a simplified schematic drawing of a photolithographic system.

Referring now to FIG. 1, therein is shown a simplified schematic of a photolithographic system 100. In the photolithographic system 100, radiation is directed from an illumination source 102 through a photomask 104 and a lens 106 onto a semiconductor wafer 108, on which will be formed a plurality of integrated circuits when completed. A photoresist layer 110 has been deposited on the semiconductor wafer 108.

The photomask 104 includes a light-transparent substrate 114, of a material such as fused silica or quartz, with a patterned mask coating 116.

The illumination source 102 produces light 118 of a single wavelength, which the photomask 104 selectively allows through as patterned light 120 to be focused by the lens 106. Focused patterned light 122 reproduces the mask pattern of the patterned mask coating 116 on selected areas of the photoresist layer 110.

After exposure, the patterned photoresist layer 110 is used as a mask in a photolithographic process to form features or to implant regions on the semiconductor wafer 108 or on various layers of material previously deposited or grown on the semiconductor wafer 108. The goal in the photolithographic field is to keep reducing the size of such features and implant regions.

Unfortunately, in photolithographic systems, even a geometrically perfect lens cannot separate two points below a minimum distance. When the two points are less than this minimum distance from each other, they cannot be separated or "resolved". This is due to diffraction and interference effects. Diffraction effects, which are due to the wave nature of the light 118, cause peaks and valleys to occur in the intensity of the light 118 passing through an opening, such as an opening in the patterned mask coating 116, and falling on the photoresist layer 110 on the semiconductor wafer 108. Interference effects occur with side-by-side openings, where the peaks and valleys of the light waves can interfere so as to cancel each other out, or can reinforce and amplify each other, depending on the locations of the openings.

Depending upon how close two points are, the diffraction effect spreads the light from these two points across the imaging lens. If the two points are sufficiently close, the light will be diffracted out of the path of the lens. In this case, the points will be too close to each other and they will be under the limit of resolution of the system. The resolution of a non-perfect lens depends upon the wavelength of the light source and the numerical aperture ("NA") of the lens. Two images are considered as being resolvable when the intensity between them drops to 80 percent of the image intensity. Thus, two images are considered resolvable when the following equation is fulfilled:

$2D = 0.6 \lambda / NA$ where:

2D is the separation of the two images;

$\lambda$ is the wavelength of the illumination source 102; and

NA is the numerical aperture of the lens 106.

In an effort to overcome diffraction and interference problems, various phase shifting systems have been developed.

Figure 2:
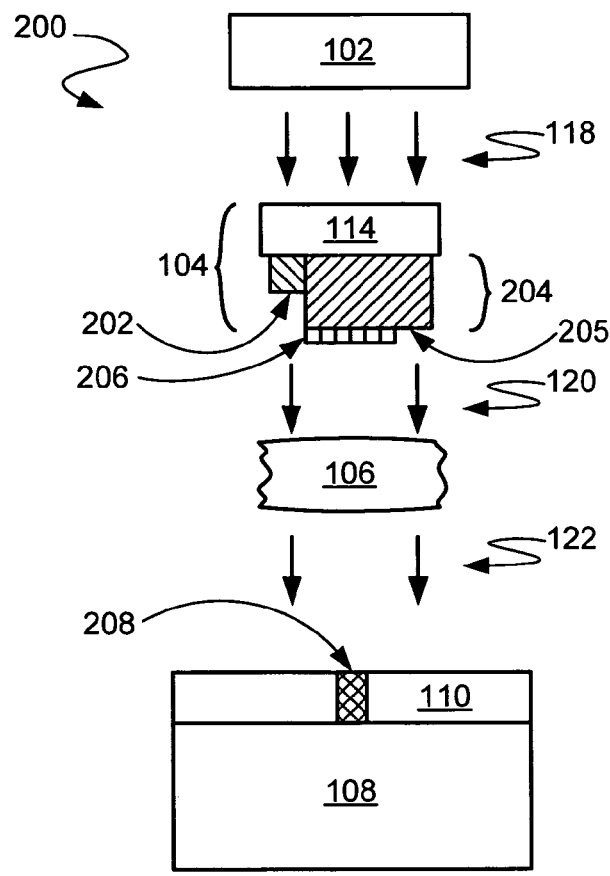
FIG. 2 is a simplified schematic of a phase shifting photolithographic system.

Referring now to FIG. 2, therein is shown a simplified schematic of a phase shifting system 200. The center portion of the lens 106 is pictured where the angle of the focused light 122 is least affected. As in the photolithographic system 100 (FIG. 1), light 118 of a single wavelength is directed from the illumination source 102 through the photomask 104 and the lens 106 onto the photoresist layer 110 on the semiconductor wafer 108.

The phase shifting system 200 has two adjacent shifters 202 and 204 located on the mask. The light 118 passes through the shifters 202 and 204, which are light transmissive and are separated by a mask feature 206.

Since phase shifting of light occurs as a function of the thickness of the shifter material, an extra layer or an extra thickening 205 of the transmissive shifter material is included in the shifter 204 to cause additional phase shifting. This extra transmissive material 205, such as silicon or quartz, produces a phase shift of 180° relative to the phase shifter 202. This corresponds to an optical path length difference of $\lambda/2$. Thus, one of the shifters 204 is out of phase by 180°, or n radians, with the other shifter 202.

Since opposite phases of light cancel and like phases reinforce where they overlap, the shifters 202 and 204 cause interference and reinforcement in the patterned light 120 that creates a photoresist feature 208 in the photoresist layer 110 that is narrower than the mask feature 206, and below or smaller than the inherent resolution limit of the lens 106 itself.

The phase shifting system 200 thus allows features such as the photoresist feature 208 to be much smaller than a system not using phase shifting. Unfortunately, however, phase shifting conflicts can occur.

Conventional computer aided design ("CAD") systems try to reassign phases of individual pairs of phase shifters to resolve conflicts at the end of a photomask design process, when all the phase conflicts are apparent. All too often, swapping the phases of a pair of shifters to resolve one conflict can generate a new conflict with another neighboring feature already located in the circuit design, and the phase shift conflicts cannot be resolved. Discovery of such irresolvable phase shift conflicts then requires the design engineers to start over at the early CAD process stage to change the shape of the features. The design and conflict resolution processes are repeated until CAD photomask layouts without phase-shift conflicts are finally produced.

For example, FIGS. 3A-3E show the various phase-shift conflicts that occur in the design of a photoresist feature, such as the photoresist feature 208 of FIG. 2, with various phase shifter combinations on a photomask, such as the photomask 104 of FIG. 2.

Figure 3A:
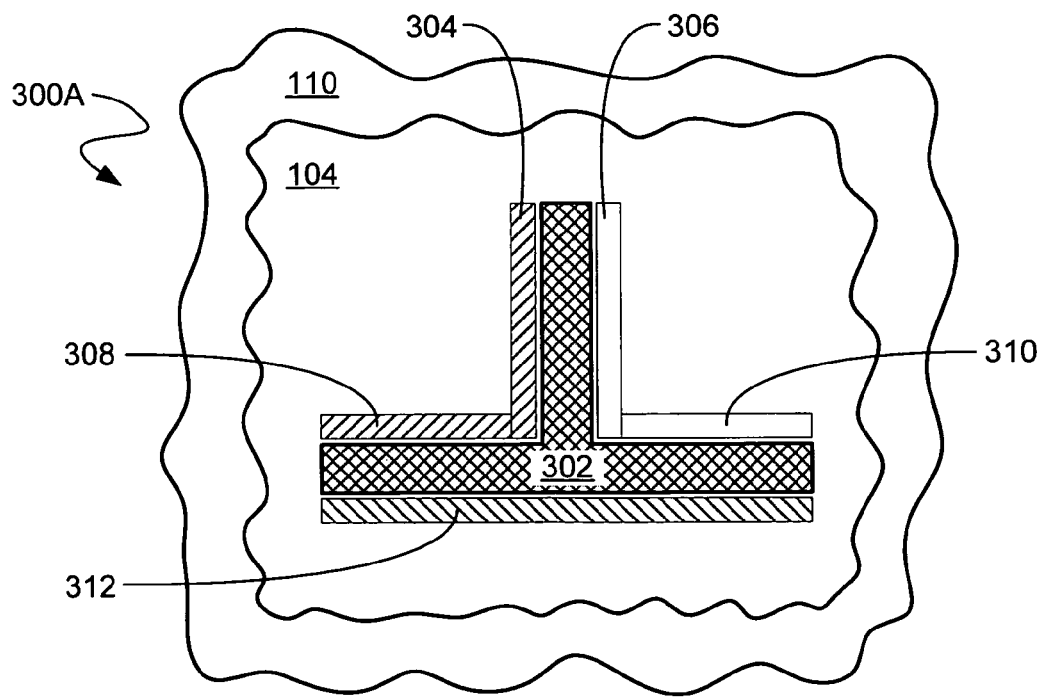
FIGS. 3A-3E are diagrammatic depictions of T-junction phase shift assignments.

Referring now to FIG. 3A, therein is shown a diagrammatic depiction 300A of T-junction phase shift assignments on the photomask 104. A proper T-junction element 302 is to be formed on the photoresist layer 110. It is expected that the proper T-junction element 302 will be formed by having phase shifters 304, 306, 308, 310, and 312 with specified phase shifts on the photomask 104.

A phase shift determination program (for example, iN-Phase from SYNOPSIS, INC of Mountain View, Calif.) develops the photomask 104 to determine the effect of different phase shifts for the phase shifters 304, 306, 308, 310, and 312. For example, as a starting point, the phase shifters 308 and 304 will provide a 0° phase shift, the phase shifter 312 will provide a 180° phase shift, and the phase shifts of the phase shifters 306 and 310 will be assigned in various attempts to obtain the proper T-junction feature 302.

Figure 3B:
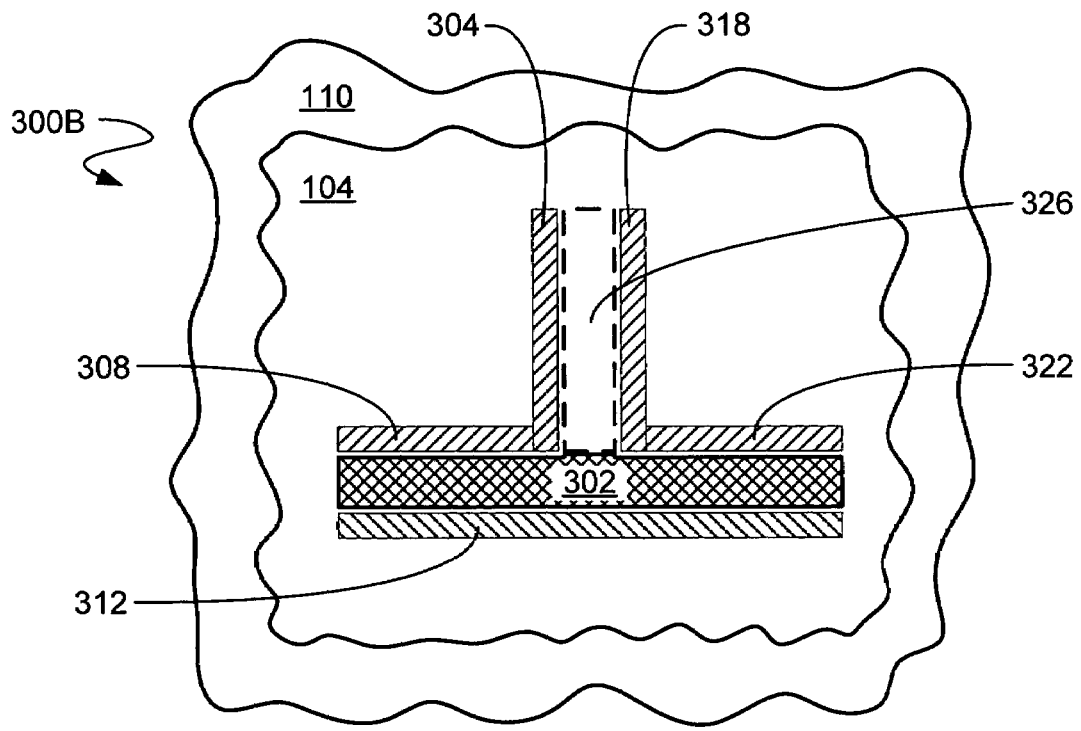

Referring now to FIG. 3B, therein is shown a diagrammatic depiction 300B of a first attempt at T-junction phase shift assignments for the photomask 104. The phase shifters 308 and 304 have a 0° phase shift, the phase shifter 312 has a 180° phase shift, and phase shifters 318 and 322 have a 0° phase shift. Unfortunately, this produces a T-junction conflict: a segment 326 of the feature 302 is not formed on the photoresist layer 110.

Figure 3C:
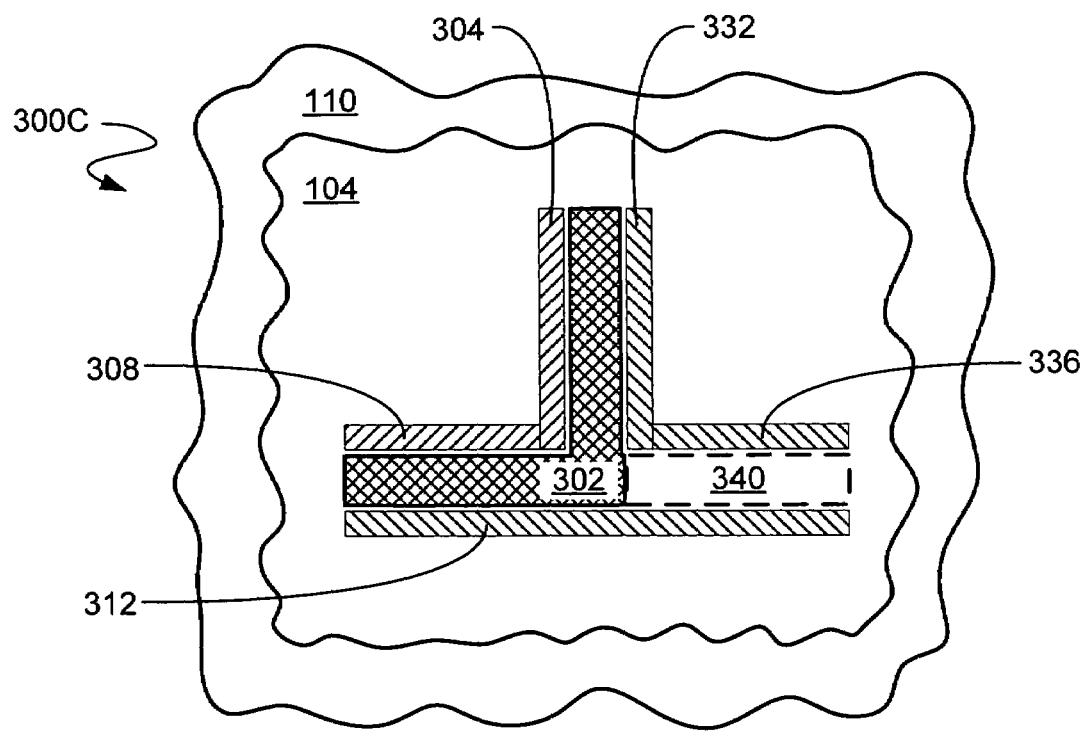

Referring now to FIG. 3C, therein is shown a diagrammatic depiction 300C of a second attempt at T-junction phase shift assignments for the photomask 104. The phase shifters 308 and 304 have a 0° phase shift, the phase shifter 312 has a 180° phase shift, and phase shifters 332 and 336 have a 180° phase shift. Unfortunately, this produces a T-junction conflict: a segment 340 of the feature 302 is not formed on the photoresist layer 110.

Figure 3D:
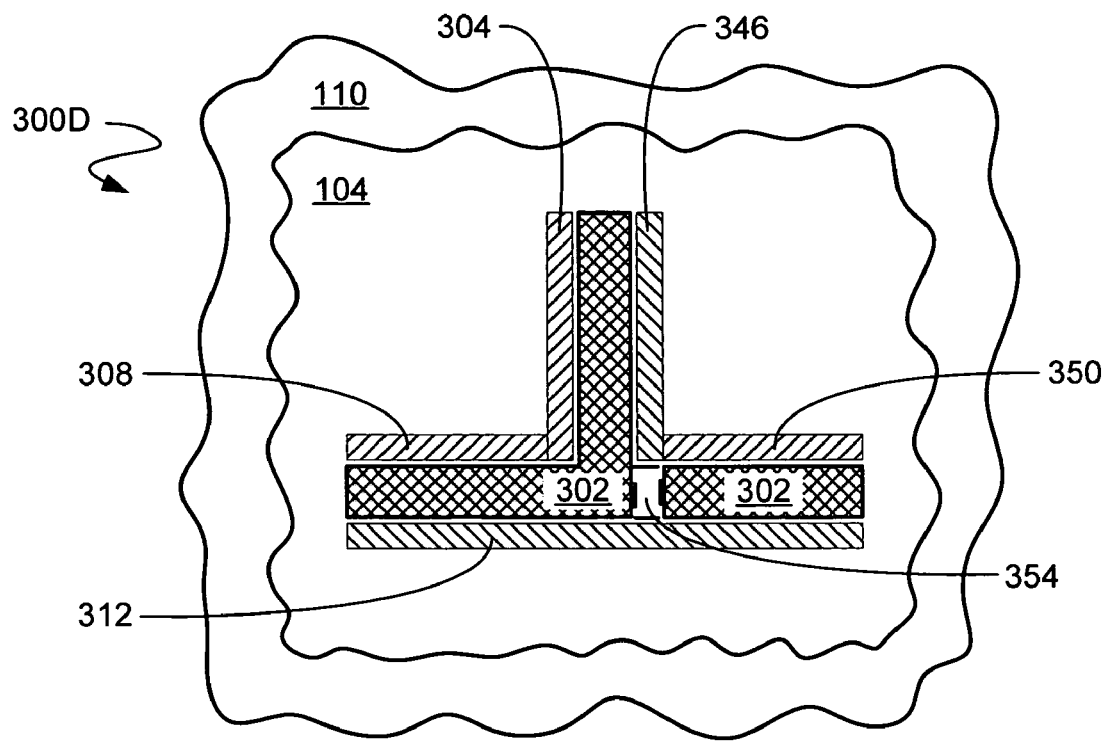

Referring now to FIG. 3D, therein is shown a diagrammatic depiction 300D of a third attempt at T-junction phase shift assignments for the photomask 104. The phase shifters 308 and 304 have a 0° phase shift, the phase shifter 312 has a 180° phase shift, phase shifter 346 has a 180° phase shift, and phase shifter 350 has a 0° phase shift. Unfortunately, this produces a T-junction conflict: a segment 354 of the feature 302 is not formed on the photoresist layer 110.

Figure 3E:
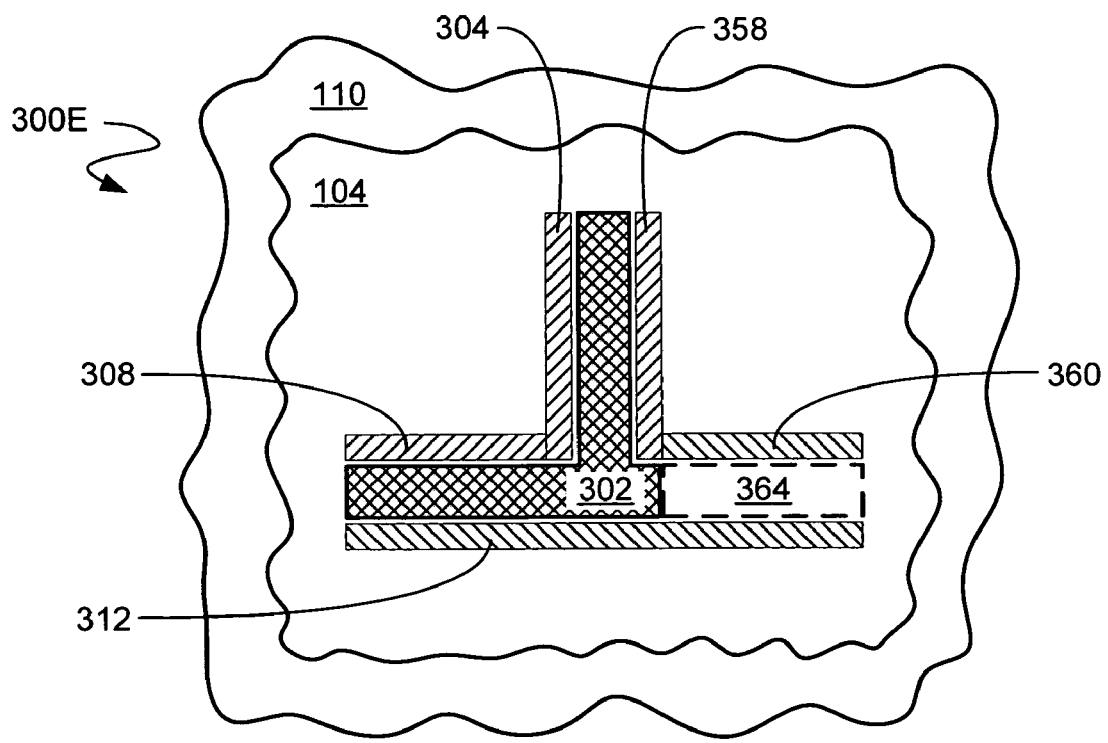

Referring now to FIG. 3E, therein is shown a diagrammatic depiction 300E of a fourth attempt at T-junction phase shift assignments for the photomask 104. The phase shifters 308 and 304 have a 0° phase shift, the phase shifter 312 has a 180° phase shift, phase shifter 358 has a 0° phase shift, and phase shifter 360 has a 180° phase shift. Unfortunately, this produces a T-junction conflict: a segment 364 of the feature 302 is not formed on the photoresist layer 110.

It will be noted that for FIGS. 3B-3E, there are in fact no combinations of the phase shifters 304, 306, 308, 310, and 312 that eliminate all phase conflicts. Before the photomask can be manufactured, however, all phase shift conflicts must be resolved.

Figure 4:
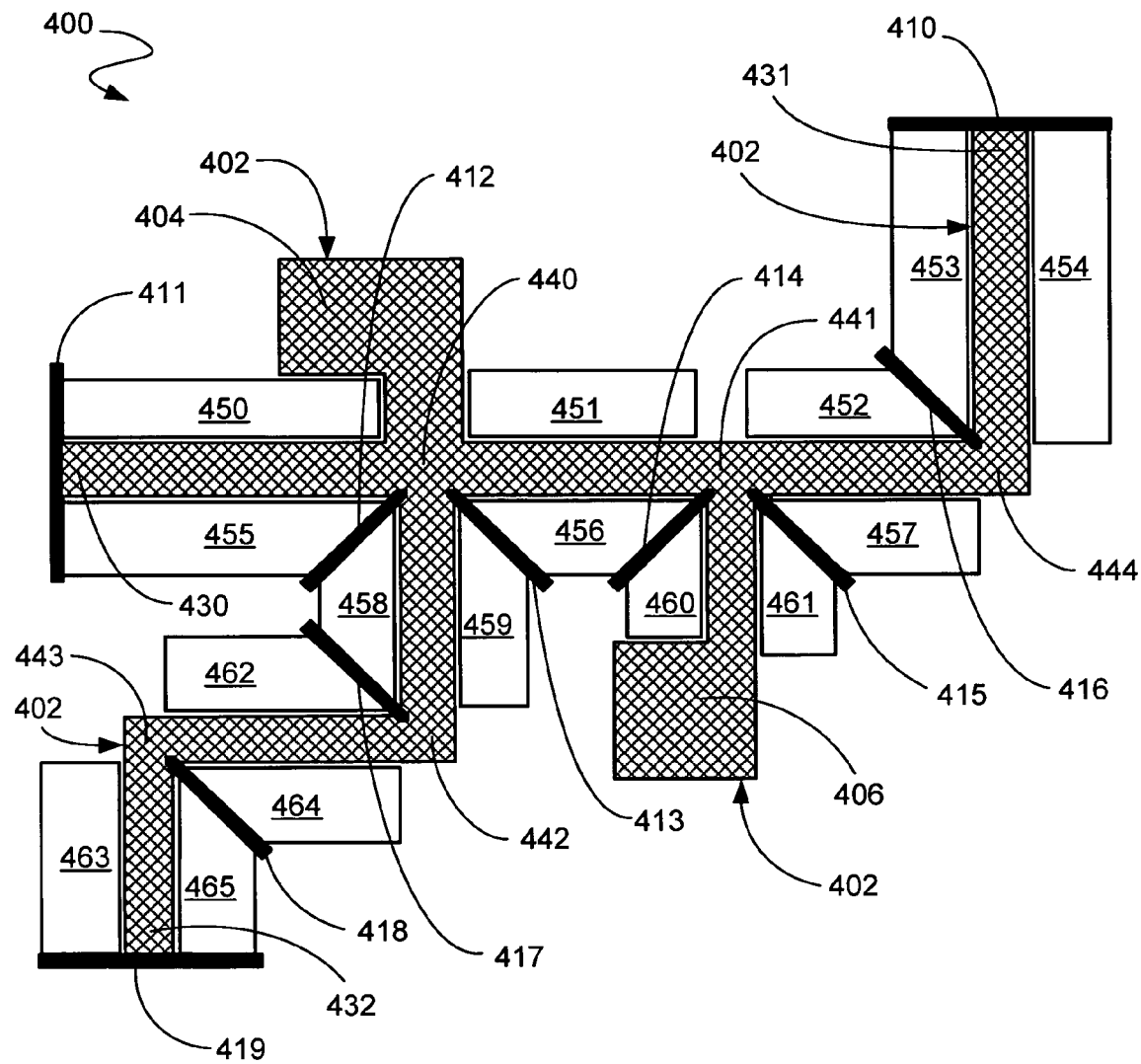
FIG. 4 is an example of phase assignment according to an embodiment of the present invention.

Referring now to FIG. 4, therein is shown an example of a phase assignment 400 in accordance with an embodiment of the present invention. A feature 402 has been designed for development on a photoresist layer (not shown). Sub-features 404 and 406 are large features that do not require phase shifting.

Before phase assignment for a photomask (not shown), software modifies the design of the feature 402 by adding cut lines 410-419 to all line ends 430-432 and at an oblique angle with respect to at least one of the lines of line junctions 440-444. Line junction 440 is a cross junction, line junction 441 is a T-junction, and line junctions 442-444 are elbow junctions. The cut lines 410-419 force the creation of many small phase regions 450-465 in the design of the feature 402. For example, by preventing the union of the two phase regions 464 and 465, the cut line 418 compels separate phase assignments for the phase regions 464 and 465.

Software assigns phases to the many small phase regions 450-465. Previously, with fewer, larger phase regions, phase assignment options were limited and there was a considerable likelihood of phase conflicts. With the embodiment of the present invention, however, the many small phase regions 450-465 provide a greatly increased number of possible combinations and permutations for phase assignment. The many small phase regions 450-465 thus greatly increase the degrees of freedom that are available for phase assignment. As the number of phase assignment options thus increases, the probability of successful, efficient full chip phase assignment is greatly improved. Thus, the time is decreased between photomask design and photomask manufacturing.

In addition, in order to completely separate the phase regions 450-465, the cut lines 410-419 in one embodiment extend out with lengths greater than the widths of the small phase regions 450-465. Cut lines 410, 411, and 419 at line ends 430-432 have a length greater than the width of the respective phase regions 453 and 454, 450 and 455, and 463 and 465. However, cut lines 412-418 at line junctions 440-444 have a length greater than a length equal to $\sqrt{2}$ times the width of the respective phase regions 455 and 458, 456 and 459, 456 and 460, 457 and 461, 458 and 462, 464 and 465, and 452 and 453. This also helps with phase assignment by distinctly separating the small phase regions 450-465 from one another.

Figure 5:
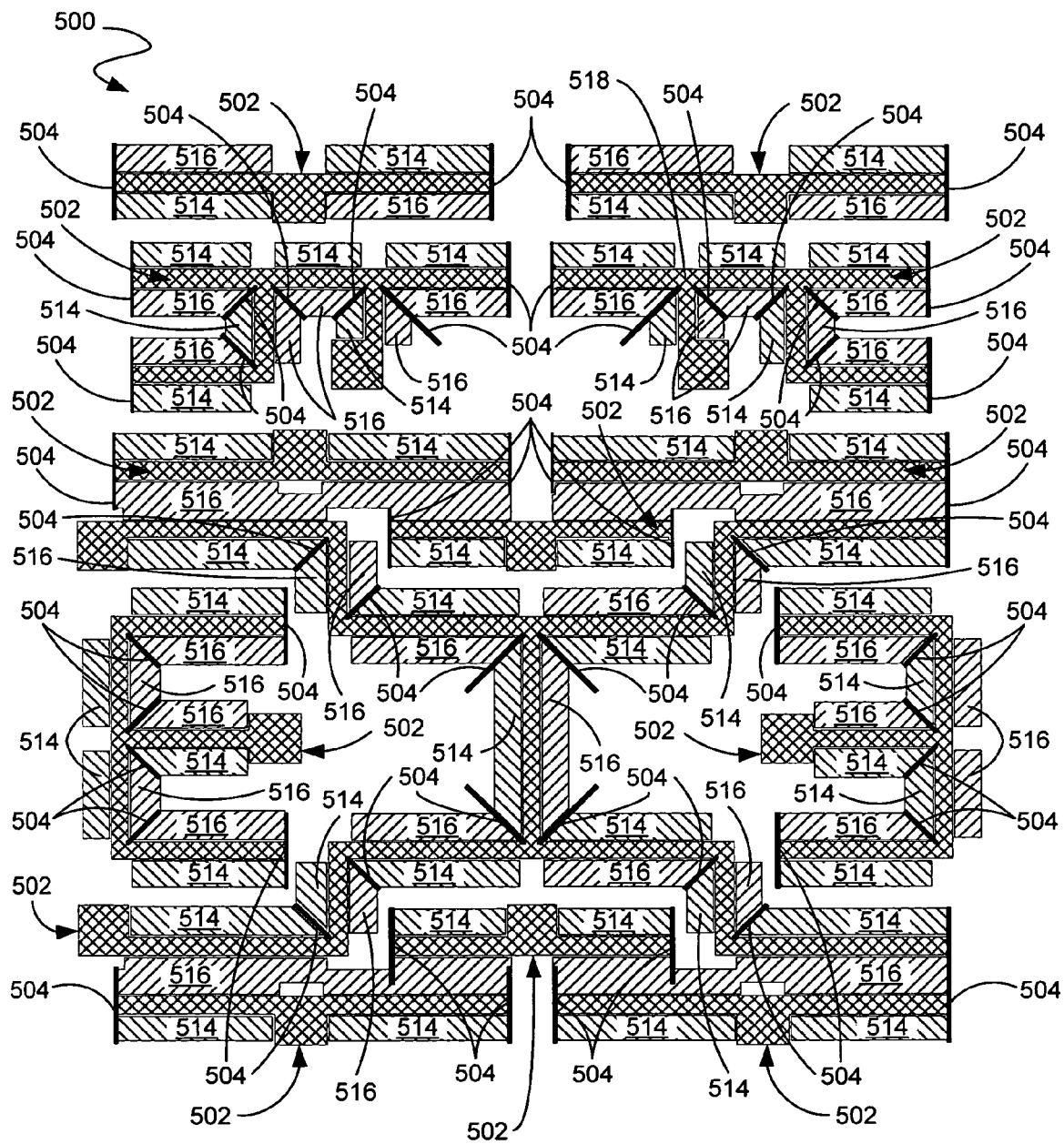
FIG. 5 is an example of an initial phase layout.

Referring now to FIG. 5, therein is shown an example of an initial phase layout 500 in accordance with an embodiment of the present invention. A semiconductor design 502 has been created for development on a photoresist layer (not shown). Cut lines 504 have been added for phase regions 514 and 516, and the phase regions 514 and 516 have been assigned phases for development on a photomask layer (not shown). The phase regions 514 are a 0° phase shift. The phase regions 516 are a 180° phase shift. Phase conflicts, such as the T-junction conflict illustrated in FIGS. 3A-3E, have been resolved as can be seen, for example, at T-junction 518.

Since all the phase conflicts have been successfully resolved, it is now possible to proceed to the final phase layout stage. However, prior thereto, the cut lines 504 are removed from the semiconductor design 502, leaving cut line spaces.

Figure 6:
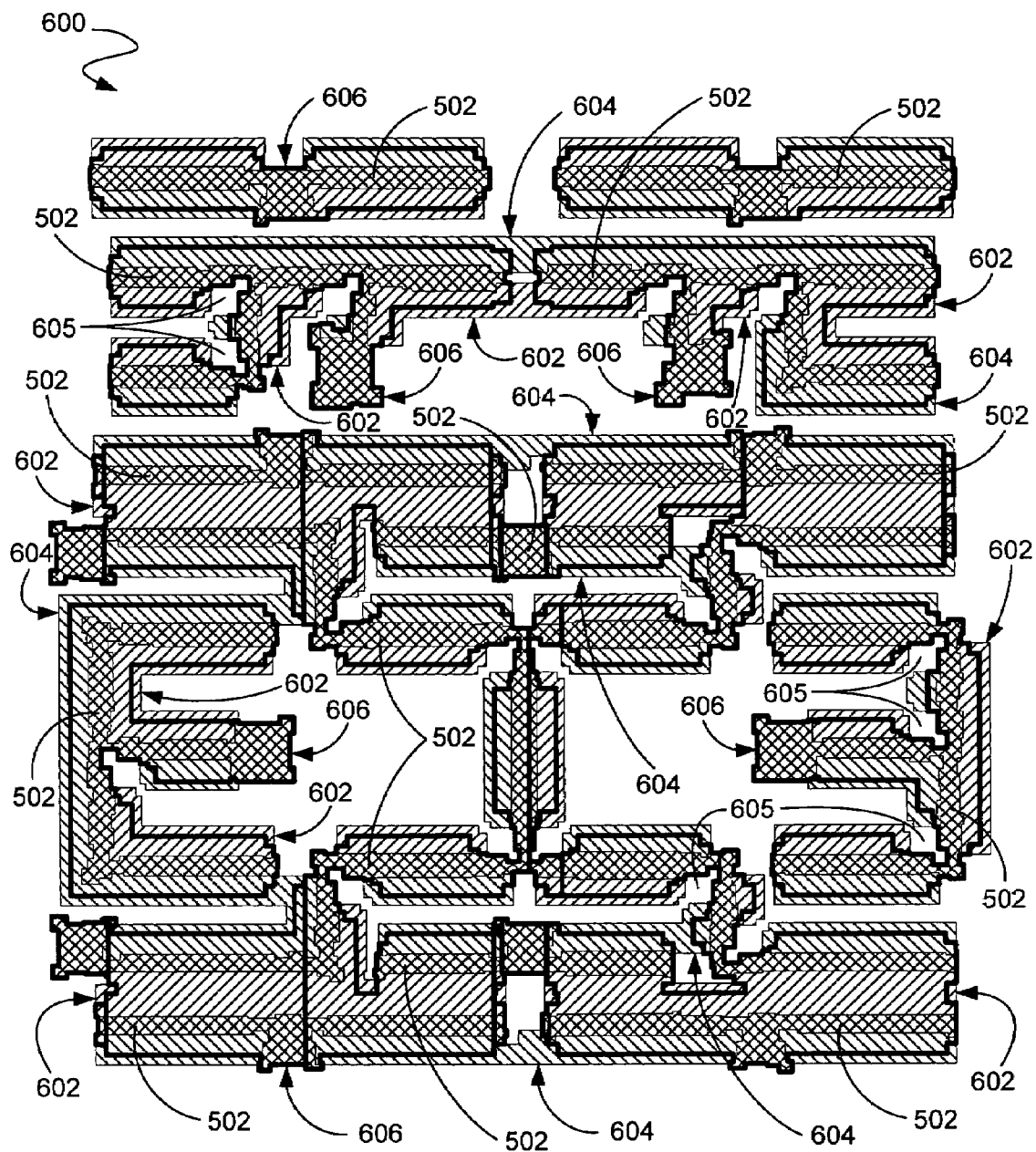
FIG. 6 is an example of a final phase layout.

Referring now to FIG. 6, therein is shown an example of a final phase layout 600 after optical proximity correction. A photoresist layer and a photomask are not shown. By applying modifications to compensate for distortions caused by optical diffraction and resist process effects, optical proximity correction results in slight shape changes to the semiconductor design 502. Common 1800 phase shift regions 602 have been merged, and common 0° phase shift regions 604 have been merged. Cut line spaces 605 between 180° phase shift regions 602 and 0° phase shift regions 604 are enlarged.

The enlarged cut line spaces 605 weaken the destructive interference between 180° phase shift regions 602 and 0° phase shift regions 604. Thus the formation of artifacts created during photolithography is reduced, and the efficiency of a trim mask 606 is improved. The trim mask 606 is used to protect the semiconductor design 502 during multiple photolithographic steps and to trim away artifacts. In addition, as indicated above, the cut lines 504 (FIG. 5) have all been removed from the semiconductor design 502 (FIG. 5). A photomask can now be manufactured.

Figure 7:
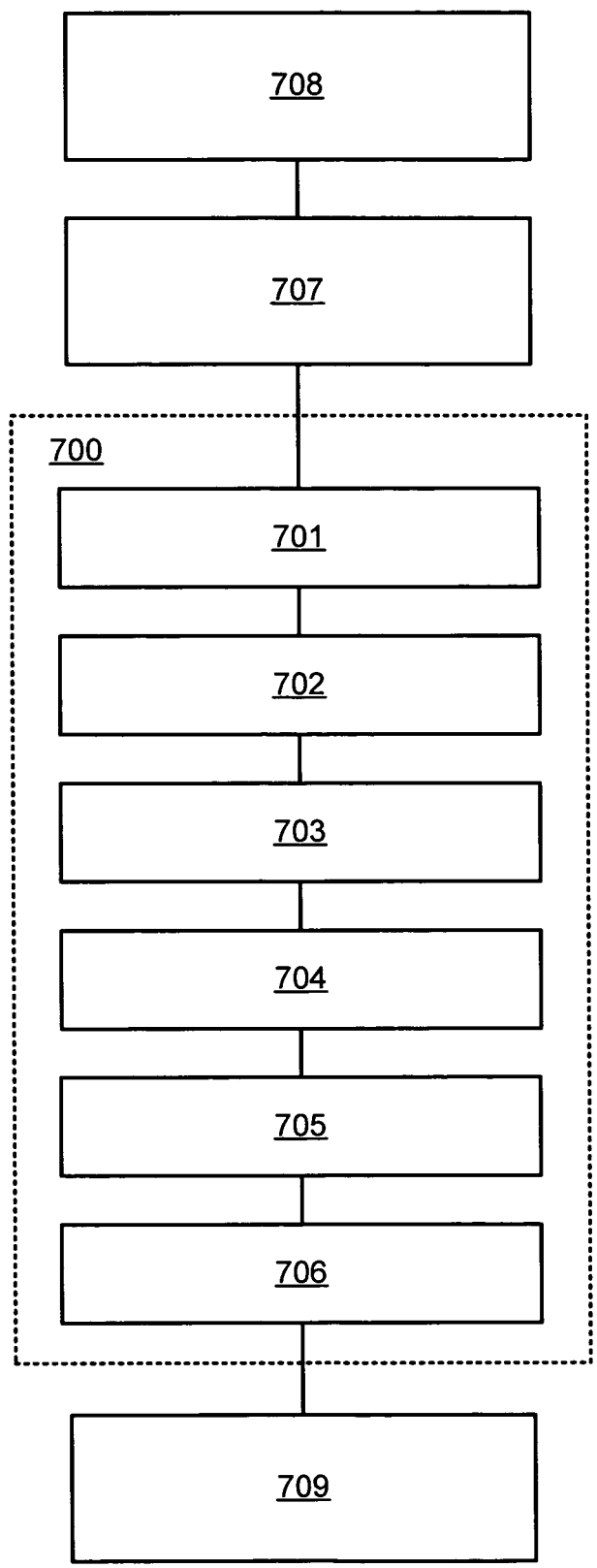
FIG. 7 is a block diagram of a phase assignment system.

Referring now to FIG. 7, therein is shown a block diagram of a phase assignment system 700 according to an embodiment of the present invention. The phase shift assignment system 700 is the result of the discovery that at times a single fundamental block can solve the problems presented but often there are four fundamental blocks to solving the problems presented.

The six fundamental blocks are an adding block 701, an assigning block 702, a removing block 703, a merging block 704, an increasing block 705, and a directing block 706. Each of the blocks can stand independently in the phase shift assignment system 700, and within these blocks may be included various commercially available techniques, methodologies, processes, and approaches as well as the invention disclosed herein. The six fundamental blocks are discussed in the approximate chronology that the blocks are used in the phase assignment system 700.

The phase shift assignment system 700 includes various elements of commercially available production, design, and development semiconductor equipment and circuitry, which operate on and manipulate information and/or data, which are generically defined herein as "information". The phase shift assignment system 700 receives information from a device 707, such as a semiconductor circuit design system, which is connected to a semiconductor design 708, having features and phase regions. The phase shift assignment system 700 provides information to a photomask manufacturing system 709.

The semiconductor design 708 can be anything from a full semiconductor chip pattern down to features and phase regions of an individual semiconductor device on a die. The photomask manufacturing system 709 can be any technique, method, process, or approach for the production of one or more photomasks.

In the adding block 701, cut lines are added, in an initial phase region layout, to features at all line ends and at an oblique angle with respect to at least one of the lines of line junctions. Cut lines divide the phase regions into smaller phase regions and may have a length greater than the width of the phase regions. Cut lines at line junctions may have a length equal to $\sqrt{2}$ times the width of the respective phase regions.

Next, in the assigning block 702, 0° phases or 180° phases are assigned to respective phase regions. Phases are assigned in a configuration that resolves phase assignment conflicts.

In the removing block 703, following the phase assignments, the cut lines from the adding block 701 are removed in a final phase region layout.

In the merging block 704, phase regions with commonly assigned phases are merged.

In the increasing block 705, the spacing between zero degree phase and 180 degree phases is increased.

Finally, in the directing block 706, the manufacture of a photomask with the assigned phase regions is directed.

Figure 8:
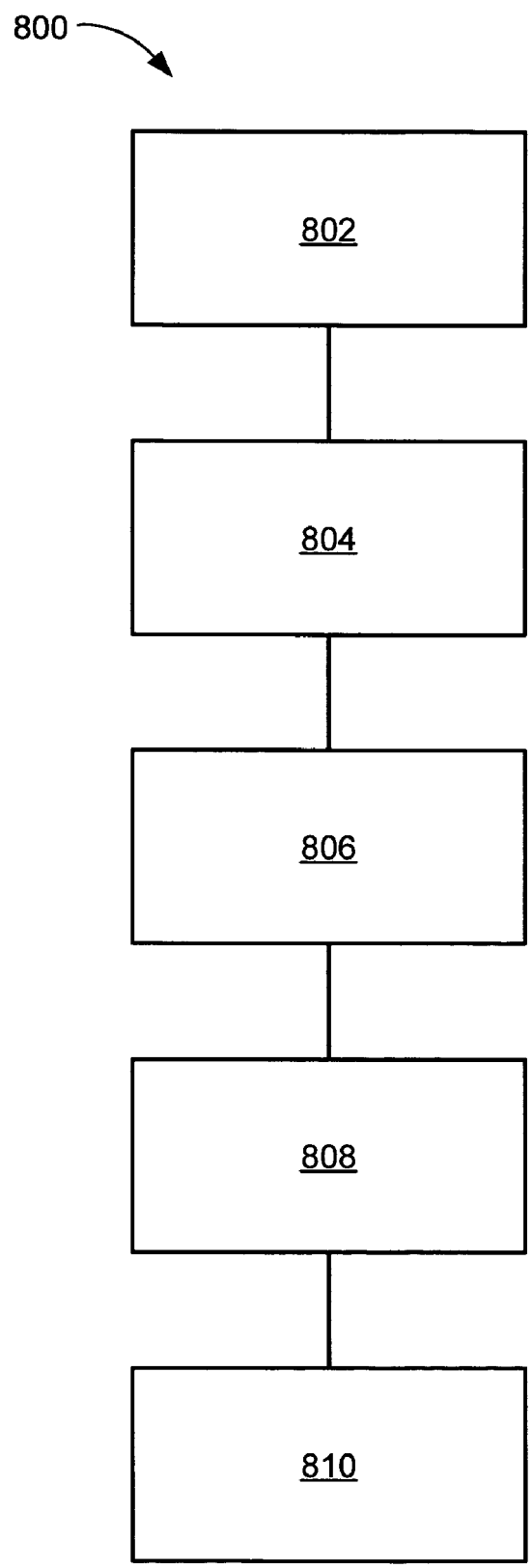
FIG. 8 is a flow chart of a method for phase shift assignment in accordance with an embodiment of the present invention.

Referring now to FIG. 8, therein is shown a flow chart of a method 800 for phase shift assignment in accordance with an embodiment of the present invention. The method 800 includes providing a semiconductor design having features at line ends, features at line junctions, and phase regions in a block 802; adding cut lines to the features at line ends in a block 804; adding cut lines to the features at line junctions in a block 806; assigning phases to the phase regions in a block 808; and directing the manufacture of a photomask having the assigned phase regions in a block 810.

Thus, it has been discovered that the phase shift assignment method and apparatus of the present invention furnish important and heretofore unknown and unavailable solutions, capabilities, and functional advantages for phase shift assignment. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A phase shift assignment method comprising:
   providing a semiconductor design having:
      at least one feature at one of:
         a line end; and
         a line junction; and
      phase regions having a width and a length;
   adding at least one cut line to:
      such features at line ends, the at least one cut line having a length greater than the width of the phase regions; and
      such features at line junctions, the at least one cut line having a length greater than $\sqrt{2}$ times the width of the phase regions;
   assigning phases to the phase regions; and
   directing the manufacture of a photomask having the assigned phase regions.

2. The method as claimed in claim 1 wherein adding at least one cut line to at least one of such features at line junctions further comprises adding at least one cut line to at least one such feature at an elbow junction, a cross junction, a T-junction, or a combination thereof.

3. The method as claimed in claim 1 further comprising:
   adding such cut lines in an initial phase region layout; and
   removing such cut lines in a final phase region layout.

4. The method as claimed in claim 1 wherein adding such cut lines to such features at line junctions further comprises adding cut lines that extend out from such features at an oblique angle.

5. A phase shift assignment method comprising:
   providing a full semiconductor chip pattern having features and phase regions, the phase regions having widths and lengths;
   adding cut lines having lengths greater than the widths of the phase regions to the features at all line ends;
   adding cut lines having lengths greater than $\sqrt{2}$ times the widths of the phase regions to the features at all line junctions to divide the phase regions into smaller phase regions;
   assigning zero degree phases or 180 degree phases to respective phase regions in a configuration that resolves phase assignment conflicts;
   removing the cut lines;
   merging common phase regions;
   increasing the spacing between zero degree phases and 180 degree phases; and
   directing the manufacture of a photomask with the assigned phase regions.

6. The method as claimed in claim 5 wherein the junctions are an elbow junction, a cross junction, a T-junction, or a combination thereof.

7. The method as claimed in claim 5 further comprising:
   adding the cut lines in an initial phase region layout; and
   removing the cut lines in a final phase region layout.

8. The method as claimed in claim 5 wherein the cut lines at the line junctions extend out therefrom at an oblique angle.

9. A phase shift assignment system comprising:
   circuitry for adding at least one cut line to at least one feature at one of:
      a line end of a semiconductor design having phase regions and features at line ends, the phase regions having widths and lengths and the at least one cut line having a length greater than the widths of the phase regions; and
      a line junction of a semiconductor design having phase regions and features at line junctions, the at least one cut line having a length greater than $\sqrt{2}$ times the width of the phase regions;
   circuitry for assigning phases to the phase regions; and
   circuitry for directing the manufacture of a photomask with the assigned phase regions.

10. The system as claimed in claim 9 wherein such line junctions are an elbow junction, a cross junction, a T-junction, or a combination thereof.

11. The system as claimed in claim 9 further comprising:
  circuitry for adding such cut lines in an initial phase region layout; and
  circuitry for removing such cut lines in a final phase region layout.

12. The system as claimed in claim 9 wherein the cut lines at such line junctions extend out therefrom at an oblique angle.

13. A phase shift assignment system comprising:
  circuitry for adding cut lines to the features at all line ends of a full semiconductor chip pattern having features at line ends, features at line junctions, and phase regions, the cut lines having lengths greater than widths of the phase regions at the line ends and the cut lines having lengths greater than $\sqrt{2}$ times the widths of the phase regions at the line junctions;
  circuitry for adding cut lines to the features at all line junctions of such a full semiconductor chip pattern to divide the phase regions into smaller phase regions, the cut lines having lengths greater than widths of the phase regions;
  circuitry for assigning zero degree phases or 180 degree phases to respective phase regions in a configuration that resolves phase assignment conflicts;
  circuitry for removing the cut lines;
  circuitry for merging common phase regions;
  circuitry for increasing the spacing between zero degree phases and 180 degree phases; and
  circuitry for directing the manufacture of a photomask with the assigned phase regions.

14. The system as claimed in claim 13 wherein the junctions are an elbow junction, a cross junction, a T-junction, or a combination thereof.

15. The system as claimed in claim 13 further comprising:
  circuitry for adding the cut lines in an initial phase region layout; and
  circuitry for removing the cut lines in a final phase region layout.

16. The system as claimed in claim 13 wherein the cut lines at the line junctions extend out therefrom at an oblique angle.

* * * * *